United States Patent
Chen et al.

(10) Patent No.: US 12,490,413 B2
(45) Date of Patent: Dec. 2, 2025

(54) PACKAGED DEVICE, PACKAGED MODULE, AND POWER CONVERSION DEVICE

(71) Applicant: Huawei Digital Power Technologies Co., Ltd., Shenzhen (CN)

(72) Inventors: Dong Chen, Shanghai (CN); Fenglong Lu, Shanghai (CN); Yunyu Tang, Shanghai (CN); Lei Shi, Shanghai (CN); Yunfeng Liu, Shanghai (CN); Shuyi Lv, Shanghai (CN); Pengcheng Zhang, Shanghai (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 187 days.

(21) Appl. No.: 18/468,174

(22) Filed: Sep. 15, 2023

(65) Prior Publication Data
US 2024/0096729 A1    Mar. 21, 2024

(30) Foreign Application Priority Data

Sep. 16, 2022   (CN) .......................... 202211132264.3
May 18, 2023    (CN) .......................... 202310562515.X

(51) Int. Cl.
*H05K 7/20*   (2006.01)
*H01L 23/373* (2006.01)
(Continued)

(52) U.S. Cl.
CPC .......... *H05K 7/205* (2013.01); *H01L 23/3735* (2013.01); *H01L 23/3736* (2013.01);
(Continued)

(58) Field of Classification Search
CPC .... H05K 7/205; H05K 7/209; H01L 23/3735; H01L 23/3736; H01L 23/427; H01L 23/4275; H01L 1/0204
See application file for complete search history.

(56) References Cited

U.S. PATENT DOCUMENTS 9,491,865 B1 * 11/2016 Chen ................. G06F 1/206
10,939,538 B1 * 3/2021 Wu ................... H05K 1/0204
(Continued)

FOREIGN PATENT DOCUMENTS

| CN | 111933604 A | 11/2020 |
| CN | 113451153 A | 9/2021 |
| JP | 2001068808 A * | 3/2001 |

*Primary Examiner* — Robert J Hoffberg
(74) *Attorney, Agent, or Firm* — Conley Rose, P.C.

(57) ABSTRACT

A packaged device includes a circuit board, an electronic component, and a heat storage portion. The electronic component is electrically coupled to the circuit board; and the heat storage portion is disposed on the circuit board or embedded in the circuit board, and the heat storage portion is adjacent to the electronic component, where a specific heat capacity of the heat storage portion is higher than a specific heat capacity of the circuit board, and the heat storage portion is configured to store and release heat. A heat storage material with a relatively high specific heat capacity is introduced into the packaged device, and the heat storage portion is disposed on the circuit board around the electronic component where a large amount of heat generated by the electronic component in a short time can be quickly stored in the heat storage portion and then released to the outside.

15 Claims, 11 Drawing Sheets

(51) Int. Cl.
*H01L 23/427* (2006.01)
*H05K 1/02* (2006.01)
*H01L 23/31* (2006.01)

(52) U.S. Cl.
CPC ........ *H01L 23/427* (2013.01); *H01L 23/4275* (2013.01); *H05K 1/0204* (2013.01); *H05K 7/209* (2013.01); *H01L 23/3121* (2013.01)

(56) References Cited

U.S. PATENT DOCUMENTS

| | | | |
|---|---|---|---|
| 10,945,332 B2* | 3/2021 | Silvano De Sousa ... | H05K 3/22 |
| 11,558,957 B2* | 1/2023 | Altman .................... | H05K 3/00 |
| 11,754,343 B2* | 9/2023 | Joshi .................... | F28D 20/026 |
| | | | 165/80.3 |
| 11,871,542 B2* | 1/2024 | Morimoto ............ | H05K 5/0086 |
| 12,160,946 B2* | 12/2024 | Eom .................... | H05K 1/0206 |
| 2012/0326292 A1 | 12/2012 | Ohashi et al. | |
| 2015/0249044 A1 | 9/2015 | Arora et al. | |
| 2020/0176355 A1 | 6/2020 | May et al. | |
| 2021/0131740 A1 | 5/2021 | Joshi et al. | |
| 2023/0253287 A1* | 8/2023 | Chen .................. | H01L 21/4807 |
| | | | 257/705 |

* cited by examiner

PACKAGED DEVICE, PACKAGED MODULE, AND POWER CONVERSION DEVICE

CROSS-REFERENCE TO RELATED APPLICATION

This application claims priority to Chinese Patent Application No. 202310562515.X filed on May 18, 2023 and Chinese Patent Application No. 202211132264.3 filed on Sep. 16, 2022. Both of the aforementioned applications are hereby incorporated by reference in their entireties.

TECHNICAL FIELD

This application relates to the field of power semiconductor device technologies, and in particular, to a packaged device having a good short-time heat storage capability and good heat dissipation effect, a packaged module to which the packaged device is applied, and a power conversion device to which the packaged device or the packaged module is applied.

BACKGROUND

To adapt to an increasingly high-power requirement, power semiconductor devices applied to various solar inverters, motor drivers, uninterruptible power supplies, and other circuits are increasingly evolving towards miniaturization and high density. As a size of a power semiconductor device decreases and density of an internal component increases, a heat dissipation problem greatly affects efficiency improvement of the power semiconductor device. A main structure of an existing power semiconductor device includes a ceramic substrate, a line layer located on an upper surface of the ceramic substrate, a metal layer located on a lower surface of the ceramic substrate, and an electronic component welded on the line layer, where the metal layer is coupled to a radiator, and is configured to diffuse heat inside the power semiconductor device to the radiator, to implement heat dissipation.

As shown in FIG. 1, a power semiconductor device 100' includes a circuit board 1', an electronic component 2' electrically connected to the circuit board 1', and a package body 3' for packaging the circuit board 1' and the electronic component 2', where the circuit board 1' includes a conducting layer 11', an insulating substrate 12', and a heat conducting layer 13' that are sequentially stacked, and a packaged device 100' is connected to a heat dissipation apparatus 200' by using the heat conducting layer 13'. Heat generated by the electronic component 2' during working is transferred to the heat dissipation apparatus 200' via the conducting layer 11', the insulating substrate 12', and the heat conducting layer 13', to implement heat dissipation. When heat generated by the electronic component 2' is at a normal level, this heat dissipation path can keep a temperature of the electronic component 2' within a normal working range. However, when the heat generated by the electronic component 2' during working suddenly increases in a short time, a heat dissipation capability of the existing heat dissipation path is limited, and it is difficult to transfer all the heat to the outside of the power semiconductor device 100' in time. As a result, the temperature of the electronic component 2' increases sharply in a short time, and the electronic component 2' is damaged due to overheat, thereby reducing reliability of the power semiconductor device 100'.

SUMMARY

In view of this, to resolve at least one of the foregoing defects, embodiments of this application need to provide a packaged device that has a good short-time heat storage capability and good heat dissipation effect.

In addition, embodiments of this application further provide a packaged module to which the packaged device is applied, and a power conversion device to which the packaged device or the packaged module is applied.

A first aspect of embodiments of this application provides a packaged device, where the packaged device includes a circuit board, an electronic component, and a heat storage portion. The electronic component is electrically connected to the circuit board, and the heat storage portion is disposed on the circuit board or embedded in the circuit board, and the heat storage portion is adjacent to the electronic component, where a specific heat capacity of the heat storage portion is higher than a specific heat capacity of the circuit board, and the heat storage portion is configured to store and release heat.

The heat storage portion is disposed on the circuit board around the electronic component, where the heat storage portion has a relatively high specific heat capacity and has functions of temporarily storing heat and releasing heat. The heat storage portion is introduced into the packaged device, so that the heat storage portion is closer to the heating electronic component, and a large amount of heat generated by the electronic component (especially a high-power or high-loss electronic component) in a short time can be quickly stored in the heat storage portion and then released to the outside, which is particularly applicable to an electronic component with a relatively large short-time current or a relatively high short-time loss, and can quickly and effectively reduce a temperature of the electronic component, thereby reducing a risk of damage caused by a sharp increase in a temperature of the electronic component in a short time and improving reliability and a service life of the packaged device.

With reference to the first aspect, in some embodiments, the circuit board includes a first circuit board surface and a second circuit board surface that are disposed opposite to each other, the electronic component is located on the first circuit board surface, the circuit board has at least one accommodating space, and the heat storage portion is accommodated in the accommodating space.

The heat storage portion is embedded in the circuit board, so that a process is simple and easy to implement, and does not affect an overall thickness of the circuit board. This helps reduce a volume of the packaged device while ensuring a good heat storage and heat dissipation capability. In addition, the heat storage portion is embedded in the circuit board, so that the heat storage portion is closer to a heat emitting point (that is, the electronic component), heat can reach the heat storage portion more quickly. The heat storage portion is connected to the circuit board in an embedded manner, therefore, a tightness of interface contact between the heat storage portion and the circuit board can be improved, to increase a heat diffusion rate, thereby reducing a temperature of the electronic component in time.

Further, the at least one accommodating space has at least one of the following three structure forms: the at least one accommodating space runs through the first circuit board surface to form a first recess portion, and the first recess portion is configured to accommodate the heat storage portion, the at least one accommodating space runs through the second circuit board surface to form a second recess portion, and the second recess portion is configured to accommodate the heat storage portion, and the at least one accommodating space runs through the first circuit board surface and the second circuit board surface to form a through hole portion, where the through hole portion is configured to accommodate the heat storage portion.

There is a plurality of manners of embedding the heat storage portion in the circuit board, and the manners may be adjusted based on an actual requirement, to improve heat storage efficiency. The accommodating space may form a groove structure such as the first recess portion and the second recess portion, or may form an opening structure such as the through hole portion. A forming process is simple and easy to operate, and the overall thickness of the circuit board is not affected. In addition, a volume of a required heat storage material may be calculated based on actual power of the electronic component, to flexibly adjust volumes of the first recess portion, the second recess portion, and the through hole portion, so that a heat storage effect of the accommodated heat storage portion is optimal.

With reference to the first aspect, in some embodiments, the circuit board includes a conducting layer, the conducting layer includes a first surface and a second surface that are disposed opposite to each other, the first surface forms the first circuit board surface, and the second surface forms the second circuit board surface.

Further, the accommodating space includes a first accommodating cavity, the first accommodating cavity is located at the conducting layer, and the heat storage portion is accommodated in the first accommodating cavity.

The heat storage portion is applicable to many application scenarios. The circuit board in this embodiment may be a single-layer structure including a conducting layer, that is, the electronic component is welded only on the conducting layer (for example, a power switch device), and the heat storage portion is introduced into the conducting layer, so that the heat storage portion is closer to the heating electronic component. The heat storage portion can quickly store a large amount of heat generated by the electronic component in a short time, and heat storage efficiency is higher, thereby quickly and effectively reducing the temperature of the electronic component, and reducing a risk of damage to the electronic component.

Further, the first accommodating cavity is disposed in a non-electrical through-current area of the conducting layer.

The first accommodating cavity is disposed in the non-electrical through-current area of the conducting layer. In this way, normal electrical through-current of the conducting layer is not affected after the heat storage portion is disposed.

With reference to the first aspect, in some embodiments, the circuit board further includes a heat conducting layer, the heat conducting layer is disposed on a side that is of the conducting layer and that is away from the electronic component, and the heat conducting layer includes a third surface close to the second surface and a fourth surface disposed opposite to the third surface, and the fourth surface forms the second circuit board surface.

By adding the heat conducting layer to the surface that is of the conducting layer and that is away from the electronic component, heat conducting efficiency of the packaged device can be improved.

Further, the accommodating space includes a second accommodating cavity, the second accommodating cavity is located at the heat conducting layer, and the heat storage portion is accommodated in the second accommodating cavity.

For a double-layer structure form of the circuit board, the heat storage portion may be further disposed in the heat conducting layer, thereby extending an application scenario of the heat storage portion. In this case, the heat storage portion may be located right below the electronic component, or may be disposed around an edge of the electronic component, to implement a function of rapid heat storage. In addition, the heat conducting layer is usually thicker than the conducting layer, and is more likely to be embedded with the heat storage portion.

With reference to the first aspect, in some embodiments, the circuit board includes an insulating substrate, and the insulating substrate is located between the conducting layer and the heat conducting layer.

In this embodiment, the circuit board has a sandwich structure, and the heat storage portion may also be applied to the three-layer structure, thereby further extending the application scenario of the heat storage portion. By adding the insulating substrate, overall strength of the circuit board may be improved, and a heat dissipation capability of the insulating substrate is relatively strong, thereby further promoting heat dissipation.

With reference to the first aspect, in some embodiments, a material of the heat storage portion includes at least one of a metal and a phase-change material.

The metal and the phase-change material have a specific heat capacity higher than that of the circuit board, and have excellent heat storage and heat dissipation capabilities. Using this type of material as the heat storage portion can improve a short-time heat storage capability and heat dissipation efficiency of the heat storage portion.

A second aspect of embodiments of this application provides a packaged module, where the packaged module includes the packaged device according to the first aspect of embodiments of this application and a heat dissipation apparatus located on a surface that is of the circuit board and that is away from the electronic component.

Heat dissipation efficiency can be further improved by adding the heat dissipation apparatus to the packaged device.

A third aspect of embodiments of this application provides a power conversion device, where the power conversion device includes a circuit board, and the packaged device according to the first aspect of embodiments of this application, or includes the packaged module according to the second aspect of embodiments of this application, where the packaged device or the packaged module is disposed on the circuit board.

In the power conversion device, the heat storage portion in the packaged device can play a good role of heat storage and heat dissipation, and reduce a risk of damage caused by a sharp increase in a temperature of the electronic component in a working process in a short time, thereby improving reliability of the power conversion device and prolonging a service life of the power conversion device.

LIST OF REFERENCE NUMERALS OF MAIN ELEMENTS

Figure 1:
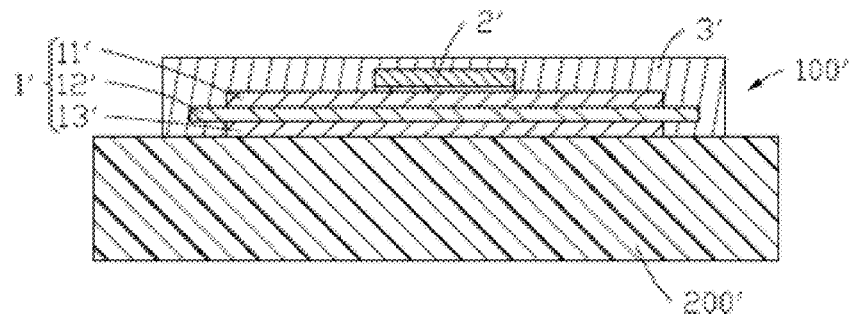
FIG. 1 is a schematic diagram of a structure of a packaged module.

Packaged device 100, 200, 300, 400, 500, 600
Circuit board 1', 10, 10a, 10b, 3200, 4200
First circuit board surface 101
Second circuit board surface 102
First recess portion 103
Second recess portion 104
Through hole portion 105
Conducting layer 11', 1, 60
First surface 12, 62
Second surface 13, 63
First accommodating cavity 11, 61
Insulating substrate 12', 2
Heat conducting layer 13', 3
Third surface 32
Fourth surface 33
Second accommodating cavity 31
Heat storage portion 20
Electronic component 2', 30, 70
Package body 3', 40
Shell 50
Power semiconductor device 100'
Packaged module 1000, 2000
Heat dissipation apparatus 200', 1100, 2100
Power conversion device 3000, 4000
Housing 3100, 4100

DESCRIPTION OF EMBODIMENTS

To reduce a risk that an electronic component 2' (especially an electronic component with a relatively large short-time current or a relatively high short-time loss) in a conventional power semiconductor device 100' is damaged due to a sharp temperature rise in a short time, this application provides a packaged device. The following describes embodiments of this application with reference to the accompanying drawings in embodiments of this application.

Embodiment 1

Figure 2:
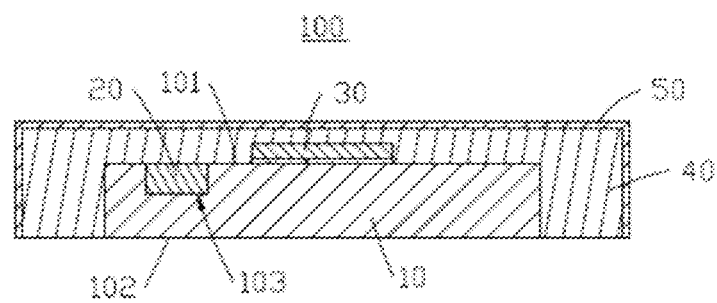
FIG. 2 is a schematic diagram of a structure of a packaged device according to an embodiment of this application.

Refer to FIG. 2, an embodiment of this application provides a packaged device 100 with good heat storage and heat dissipation capabilities. The packaged device 100 may be but is not limited to a power semiconductor device, and may be configured to perform power processing, including frequency conversion, voltage conversion, current conversion, power management, and the like.

The packaged device 100 includes a circuit board 10, an electronic component 30, and a heat storage portion 20. The electronic component 30 is electrically connected to the circuit board 10, the heat storage portion 20 is disposed on the circuit board 10 or embedded in the circuit board 10, and the heat storage portion 20 is adjacent to the electronic component 30, where a specific heat capacity of the heat storage portion 20 is higher than a specific heat capacity of the circuit board 10, and the heat storage portion 20 is configured to store and release heat. In a working process of the packaged device 100, both the electronic component 30 and the circuit board 10 generate heat. However, because power consumption of the electronic component 30 is relatively large, and heat generated by the electronic component 30 is mainly used, the heat storage portion 20 is mainly configured to store and release heat generated by the electronic component 30, especially high heat generated in a short time.

The circuit board 10 includes a first circuit board surface 101 and a second circuit board surface 102 that are disposed opposite to each other, the electronic component 30 is located on the first circuit board surface 101, the circuit board 10 has at least one accommodating space, and the heat storage portion 20 is accommodated in the accommodating space.

Figure 3:
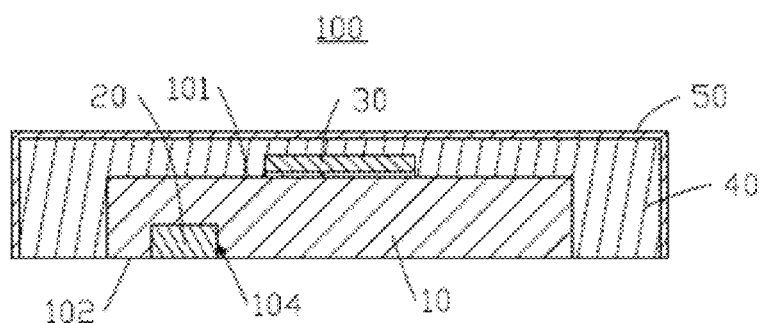
FIG. 3 is a schematic diagram of a structure of a packaged device according to another embodiment of this application.
Figure 4:
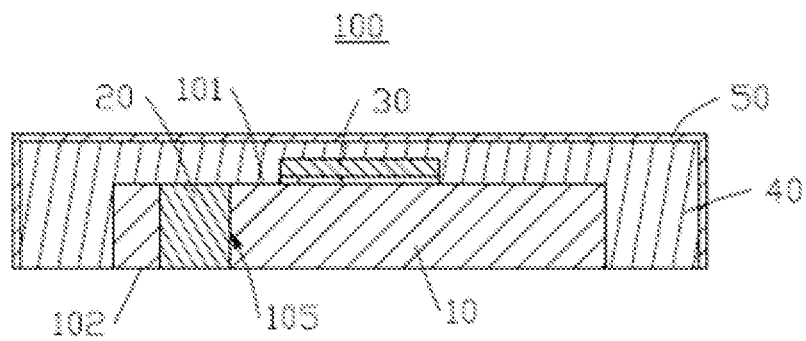
FIG. 4 is a schematic diagram of a structure of a packaged device according to still another embodiment of this application.

Refer to FIG. 2 to FIG. 4, the accommodating space has at least one of the following three structure forms.

As shown in FIG. 2, the accommodating space runs through the first circuit board surface 101 to form a first recess portion 103, and the first recess portion 103 is configured to accommodate the heat storage portion 20. As shown in FIG. 3, the accommodating space runs through the second circuit board surface 102 to form a second recess portion 104, and the second recess portion 104 is configured to accommodate the heat storage portion 20. As shown in FIG. 4, the accommodating space runs through the first circuit board surface 101 and the second circuit board surface 102 to form a through hole portion 105, and the through hole portion 105 is configured to accommodate the heat storage portion 20.

It may be understood that there may be one or more circuit boards 10, and a plurality of circuit boards 10 are electrically connected to each other. It may be further understood that setting of the heat storage portion 20 above may be applicable to a plurality of circuit board structures. For example, the circuit board may be a single-layer board, a double-layer board, or a multi-layer board, and the circuit board may also be a single-sided board or a double-sided board. When the circuit board is the double-sided board, electronic components may be disposed on both opposite surfaces of the circuit board, or when the circuit board is the multi-layer board, the electronic component may be not only on the surface of the circuit board, but also embedded inside the circuit board. In addition, based on different specific structures of the circuit board 10, the first circuit board surface 101 and the second circuit board surface 102 have different representation forms.

Figure 5:
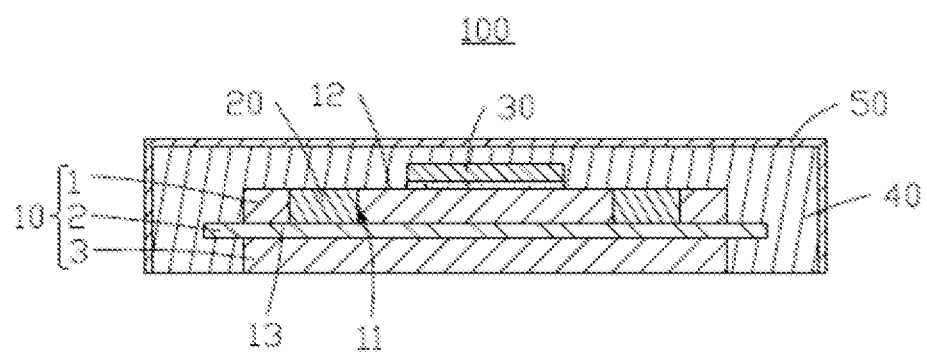
FIG. 5 is a schematic diagram of a structure of a packaged device according to another embodiment of this application.

Refer to FIG. 5, the circuit board 10 has a three-layer structure (similar to a sandwich structure), and the circuit board 10 includes a conducting layer 1, an insulating substrate 2, and a heat conducting layer 3 that are sequentially stacked, where the conducting layer 1 is electrically connected to the electronic component 30. In this case, refer to FIG. 2, a surface of the conducting layer 1 away from the insulating substrate 2 forms the first circuit board surface 101, and a surface of the heat conducting layer 3 away from the insulating substrate 2 forms the second circuit board surface 102.

The conducting layer 1 may be a metal conducting layer, and a material of the conducting layer 1 includes but is not limited to copper, copper alloy, or the like.

The heat conducting layer 3 may be a metal heat conducting layer, and may include but is not limited to copper or copper alloy, or may be another heat conducting material, for example, high heat conducting resin.

The insulating substrate 2 has functions of insulation and heat conduction. The insulating substrate 2 is made of an insulating heat conduction material, which may be insulating ceramic or high heat conductivity insulation resin, but is not limited thereto. In some embodiments, the insulating substrate 2 may be an insulating ceramic substrate.

In some embodiments, the circuit board 10 may be manufactured by using a direct bond copper (DBC) substrate or an active metal brazed (AMB) substrate. The circuit board 10 not only features higher heat conductivity, high bonding strength between a copper layer and the insulating substrate 2 (for example, silicon nitride ceramic), and the like, but the circuit board 10 also has a low thermal expansion coefficient (especially, the thermal expansion coefficient of the AMB ceramic substrate is almost close to that of silicon), which can be used in high voltage operation without partial discharge. It may be understood that the heat conducting layer 3 may be relatively thick, to facilitate connection to the heat dissipation apparatus, and achieve a relatively desirable heat conducting effect.

Refer to FIG. 5 again, the electronic component 30 may include one or more active devices, for example, an active chip, including but not limited to a semiconductor power chip, a power supply chip, a digital chip, a radio frequency chip, and the like. In some embodiments, the electronic component 30 may include a power chip such as an insulated-gate bipolar transistor (IGBT), a diode, or a metal-oxide-semiconductor field-effect transistor (MOSFET). It may be understood that the electronic component 30 may further include one or more passive devices, and the passive devices include but are not limited to a resistor, a capacitor, an inductor, a filter, a coupler, and the like. A back side of the electronic component 30 may be disposed on the conducting layer 1 by using a mounting method, and may be mounted on a surface of the conducting layer 1 through welding. It may be understood that the electronic component 30 may be further mounted on the surface of the conducting layer 1 in a sintered manner.

The electronic component 30 is approximately packaged in a middle position of the circuit board 10, so that the heat storage portion 20 is easily introduced around the electronic component 30. It may be understood that, when there is a plurality of electronic components 30, the heat storage portion 20 may be disposed around an electronic component 30 with a relatively large power or a relatively high loss.

In this embodiment of this application, that the heat storage portion 20 is disposed close to the electronic component 30 means that, to quickly conduct a large amount of heat generated by the electronic component 30 in a short time to the heat storage portion 20, the heat storage portion 20 needs to be disposed as close to the electronic component 30 as possible based on actual distribution of the electronic component 30, and the heat storage portion 20 may also be disposed to touch the electronic component 30, located directly below the electronic component 30, or the like. It may be understood that, if the heat storage portion 20 is disposed at a position that is relatively far away from the electronic component 30, it is difficult to achieve an objective of storing high heat generated by the electronic component 30 in a short time. A maximum distance between the heat storage portion 20 and the electronic component 30 may be calculated based on heat generated by the electronic component 30 in a unit time, a heat conduction rate of the circuit board 10, and the like.

In some embodiments, the heat storage portion 20 is embedded in at least one of the conducting layer 1 and the heat conducting layer 3. It may be understood that the heat storage portion 20 may also be embedded in the insulating substrate 2. For example, when the insulating substrate 2 is made of the high heat conductivity insulation resin, the heat storage portion 20 may be embedded in the insulating substrate 2. It may be further understood that the heat storage portion 20 may also be directly disposed on a surface that is of the circuit board 10 and that is adjacent to the electronic component 30.

The heat storage portion 20 may be made of a material whose specific heat capacity is higher than that of the conducting layer 1, the heat conducting layer 3, and the insulating substrate 2, and includes but is not limited to at least one of metal and a phase-change material (for example, an inorganic phase-change material, an organic phase-change material, or a composite phase-change material). In some embodiments, when materials of both the conducting layer 1 and the heat conducting layer 3 are copper or copper alloy, a material of the heat storage portion 20 may be a metal whose specific heat capacity is greater than that of copper, for example, at least one of metal materials such as aluminum, aluminum alloy, iron, and ferroalloy.

In some embodiments, the heat storage portion 20 is embedded in the conducting layer 1 adjacent to the electronic component 30. The conducting layer 1 includes a first surface 12 and a second surface 13 that are disposed opposite to each other, the first surface 12 of the conducting layer 1 forms the first circuit board surface 101, and the electronic component 30 is located on the first surface 12. The accommodating space includes at least one first accommodating cavity 11 located on the conducting layer 1, and the first accommodating cavity 11 is disposed adjacent to the electronic component 30. A volume of the first accommodating cavity 11 represents a volume of the heat storage portion 20 that can be filled. A required volume of the heat storage portion 20 may be calculated based on actual power or an actual loss of the electronic component 30, to set the volume of the first accommodating cavity 11. In this way, the volume of the first accommodating cavity 11 can be flexibly adjusted, so that a total volume of the first accommodating cavity 11 is optimal, thereby avoiding a waste of a heat storage material and space of the conducting layer 1 due to an excessively large volume of the first accommodating cavity 11, and avoiding an insufficient heat storage capability due to an excessively small volume of the first accommodating cavity 11. Therefore, a specific shape of the first accommodating cavity 11 is not limited in this embodiment of this application, and the first accommodating cavity 11 may be a cube, a cylinder, or in another special-shaped cavity structure. In this embodiment of this application, the heat storage portion 20 is embedded in the conducting layer 1, so that a process is simple and easy to implement, and an overall thickness of the circuit board 10 is not affected. This helps reduce a volume of the packaged device 100 while ensuring an excellent heat storage and heat dissipation capability. In addition, the heat storage portion 20 is embedded into the conducting layer 1, so that the heat storage portion 20 is closer to a heat emitting point (that is, the electronic component 30), and heat can reach the heat storage portion 20 more quickly. In addition, the heat storage portion 20 is connected to the conducting layer 1 in an embedded manner, so that a tightness of interface contact between the heat storage portion 20 and the conducting layer 1 can be improved, to increase a heat diffusion rate, thereby reducing a temperature of the electronic component 30 in time.

It may be understood that, with reference to FIG. 2 to FIG. 4, the first accommodating cavity 11 may have three structure forms described above: the first recess portion 103, the second recess portion 104, and the through hole portion 105.

As shown in FIG. 5, in some embodiments, the at least one first accommodating cavity 11 runs through the first surface 12 and the second surface 13 to form a structure form of a through hole portion, and the heat storage portion 20 is embedded in the first accommodating cavity 11. In this embodiment of this application, the first accommodating cavity 11 is formed on the conducting layer 1 through mechanical machining, chemical etching, or optical etching. In this case, the first accommodating cavity 11 is an opening through the first surface 12 and the second surface 13, and then the first accommodating cavity 11 is filled with a heat storage material to form the heat storage portion 20. In some embodiments, a thickness of the heat storage portion 20 is consistent with a thickness of the conducting layer 1, that is, an upper surface of the heat storage portion 20 is flush with the first surface 12, and a lower surface of the heat storage portion 20 is flush with the second surface 13. It may be understood that, in another embodiment, the upper surface of the heat storage portion 20 may further protrude from the first surface 12 or be lower than the first surface 12, and the lower surface of the heat storage portion 20 may also be lower than the second surface 13. To closely combine a contact interface of the conducting layer 1 and the insulating substrate 2, the lower surface of the heat storage portion 20 is usually not disposed to protrude from the second surface 13.

Figure 6:
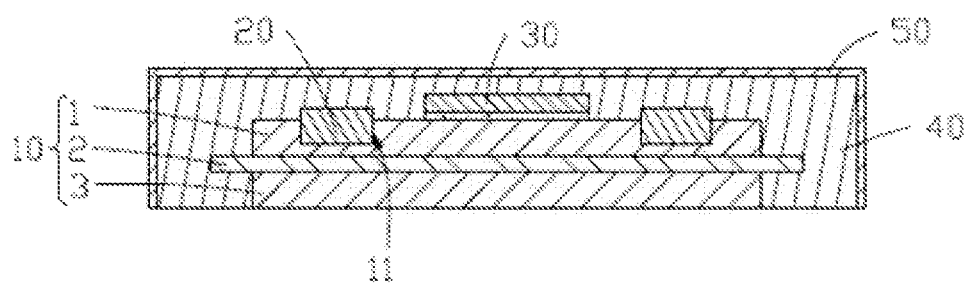
FIG. 6 is a schematic diagram of a structure of a packaged device according to still another embodiment of this application.

In another embodiment, as shown in FIG. 6, the at least one first accommodating cavity 11 may further run through only the first surface 12 to form a structure form of the first recess portion, and, the first recess portion is filled with a heat storage material to form the heat storage portion 20. It may be understood that, the at least one first accommodating cavity 11 may further run through only the second surface 13 to form a structure form of the second recess portion.

Figure 7:
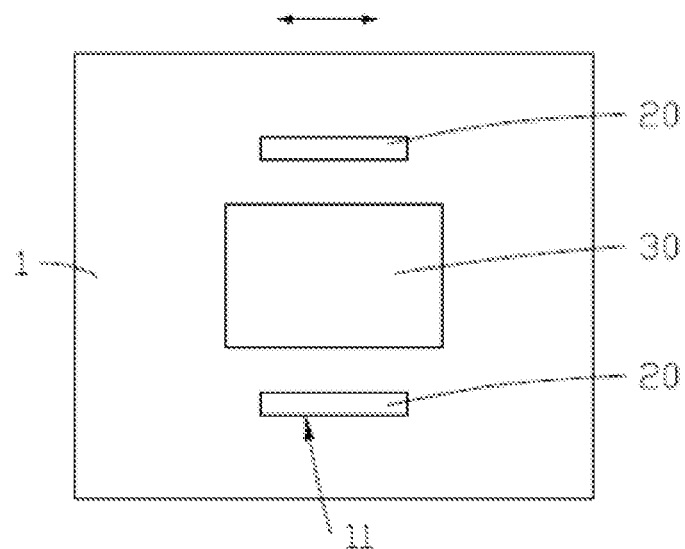
FIG. 7 is a schematic diagram of a structure of a packaged device according to still another embodiment of this application.

In some embodiments, as shown in FIG. 7, a plurality of first accommodating cavities 11 may be disposed near the electronic component 30, so that the heat storage portion 20 is as close as possible to the electronic component 30. In this way, a large amount of heat generated by the electronic component 30 in a short time can be stored in the heat storage portion 20 more quickly. A location at which the plurality of first accommodating cavities 11 are disposed on the conducting layer 1 does not affect electrical connectivity of the conducting layer 1. The plurality of first accommodating cavities 11 are usually disposed in a non-electrical through-current area of the conducting layer 1 (an electrical through-current direction is a direction of a bidirectional arrow in FIG. 7, a non-electrical through-current direction is approximately a vertical electrical through-current direction, and an area in the non-electrical through-current direction is the non-electrical through-current area). This solution is particularly applicable to a case in which a short-time current of the electronic component 30 is relatively large or a short-time loss is relatively high.

Figure 8:
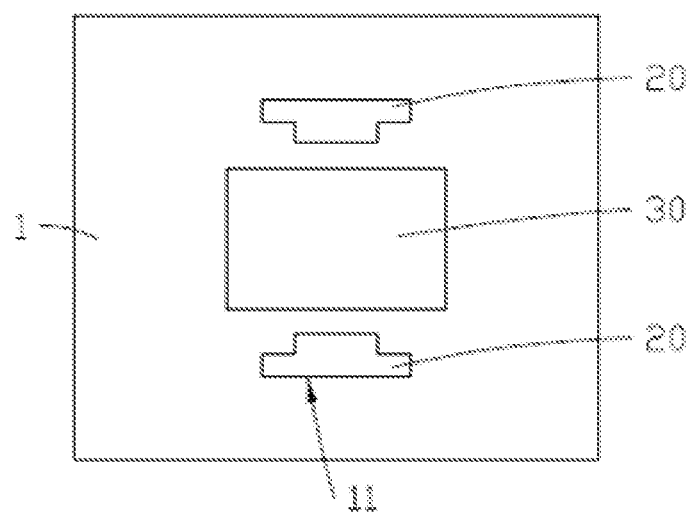
FIG. 8 is a schematic diagram of a structure of a packaged device according to still another embodiment of this application.

In another embodiment, as shown in FIG. 8, the at least one first accommodating cavity 11 may also be of a special-shaped cavity structure, including but not limited to a ladder-shaped cavity structure, a convex-shaped cavity structure, and the like. The heat storage portion 20 is embedded in the first accommodating cavity 11 having a special-shaped structure. By setting the first accommodating cavity 11 into the special-shaped structure, a volume of the heat storage portion 20 can be increased, which is particularly applicable to an electronic component 30 with a relatively large short-time current or a relatively high short-time loss, so that a short-time high temperature of the electronic component 30 can be quickly reduced.

It may be further understood that, in another embodiment, the first accommodating cavities 11 of the different types may be combined based on an actual volume of the heat storage portion 20 and a distance from the heat storage portion 20 to the electronic component 30.

In some embodiments, when a material of the heat storage portion 20 is metal, the heat storage portion 20 may be formed in the first accommodating cavity 11 in an electroplating manner.

An example heat dissipation path of the packaged device 100 is as follows. When the loss of the electronic component 30 is at a normal level, the loss is transferred to a heat dissipation apparatus 1100 outside the packaged device 100 via the conducting layer 1, the insulating substrate 2, and the heat conducting layer 3 of the circuit board 10, so that a temperature of the electronic component 30 is kept within a normal working range, to achieve the purpose of heat dissipation. When the loss of the electronic component 30 suddenly increases in a short time, the loss is not transferred to the outside of the packaged device 100 in time, and most of the loss is transferred to the heat storage portion 20 via the conducting layer 1 and is temporarily stored in the heat storage portion 20, so that in this case, a temperature rising amplitude of the electronic component 30 is significantly lower than that of a conventional packaged device without the heat storage portion 20, thereby avoiding damage to the electronic component 30 due to short-time overheating. When the loss of the electronic component 30 recovers to the normal level, heat previously stored in the heat storage portion 20 is gradually transferred to the outside of the packaged device 100 via the insulating substrate 2 and the heat conducting layer 3, so that the temperature of the electronic component 30 is gradually restored to a normal working range.

Refer to FIG. 2 again, the packaged device 100 may further include a packaged circuit board 10, an electronic component 30, and a package body 40 of the heat storage portion 20. The circuit board 10, the electronic component 30, and the heat storage portion 20 that are disposed inside may be protected by adding the package body 40, and in particular, impact of factors such as mechanical stress, chemical pollution, and light source radiation on the electronic component 30 is reduced. It may be understood that the electronic component 30 may be electrically connected to an external circuit by extending out the package body 40 by using a pin. The package body 40 is made of an insulation package material, which usually includes insulation resin, insulation silicone grease, and an insulation heat conducting filler. The insulation resin may be selected from one of acrylonitrile butadiene styrene (ABS) resin, polypropylene (PP), epoxy resin, polyphenylene oxide (PPO), polyimide (PI), polyethylene terephthalate (PET), polyethylene naphthalate (PEN), and the like. It may be understood that other package materials with characteristics such as high heat conducting coefficient, good dielectric performance, low coefficient of thermal expansion, high strength, high hardness, and non-toxicity and harmless may also be applicable to packaging of the packaged device 100 provided in this embodiment of this application.

Refer to FIG. 2 again, the packaged device 100 may further include a shell 50. The shell 50 is approximately of a square structure. The shell 50 may be made of a heat conducting material, and may be metal (for example, copper or aluminum), plastic, glass, or ceramic added with a heat conducting filler, where the heat conducting filler may be graphene particles, metal particles, metal oxide particles, or the like.

According to the packaged device 100 provided in this embodiment of this application, the heat storage portion 20 is disposed on the circuit board 10 (in the conducting layer 1) adjacent to the electronic component 30, where the heat storage portion 20 has a relatively high specific heat capacity, and has a function of temporarily storing heat and gradually releasing heat. The heat storage portion 20 is introduced into the packaged device 100, so that the heat storage portion 20 is closer to the heating electronic component 30, and a large amount of heat generated by the electronic component 30 (especially a high-power or high-loss electronic component) in a short time is quickly and temporarily stored in the heat storage portion 20. When the loss of the electronic component 30 returns to the normal level, the heat previously stored in the heat storage portion 20 is gradually released outside via the circuit board 10. The heat storage portion 20 is introduced inside the packaged device 100 and near the electronic component 30, so that a high temperature of the electronic component 30 in a short time can be quickly and effectively reduced, thereby reducing a risk of damage to the electronic component 30 in a case of a short-time high current or a short-time high loss, improving a capability of the packaged device 100 to withstand the short-time high current or the short-time high loss, expanding a working range of the packaged device 100, and improving reliability and a service life of the packaged device 100.

Embodiment 2

Figure 9:
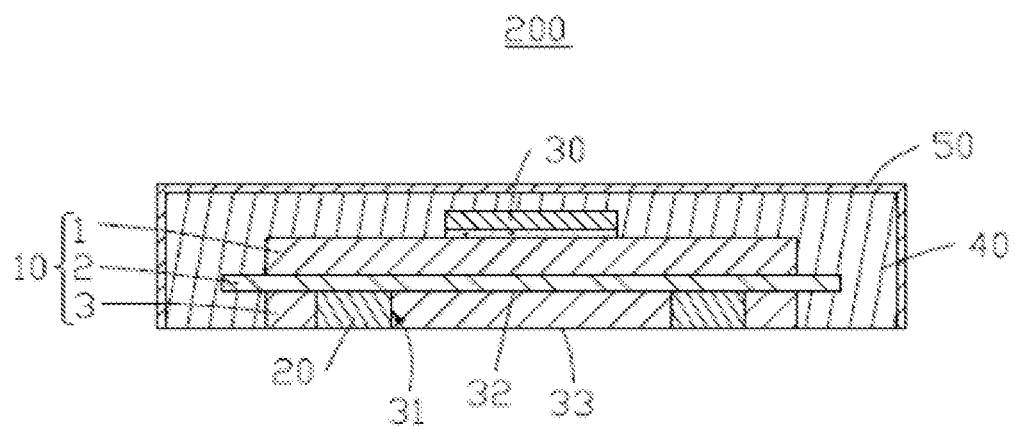
FIG. 9 is a schematic diagram of a structure of a packaged device according to still another embodiment of this application.

Refer to FIG. 9, another embodiment of this application provides a packaged device 200. A difference between the packaged device 200 and the packaged device 100 in the foregoing embodiment lies in that: a circuit board 10 also has a three-layer structure, including a conducting layer 1, an insulating substrate 2, and a heat conducting layer 3 that are sequentially stacked, where a heat storage portion 20 is embedded in the heat conducting layer 3 adjacent to an electronic component 30.

With reference to FIG. 2 to FIG. 4, the heat conducting layer 3 includes a third surface 32 close to the insulating substrate 2 and a fourth surface 33 away from the insulating substrate 2. In this case, a fourth surface 33 of the heat conducting layer 3 forms a second circuit board surface 102 of the circuit board 10, and accommodating space may further include at least one second accommodating cavity 31 located on the heat conducting layer 3, where the second accommodating cavity 31 is adjacent to the electronic component 30, and the heat storage portion 20 is located in the second accommodating cavity 31. The second accommodating cavity 31 may have three structure forms shown in FIG. 2 to FIG. 4.

A volume of the second accommodating cavity 31 represents a volume of the heat storage portion 20 that can be filled. A required volume of the heat storage portion 20 may be calculated based on actual power or an actual loss of the electronic component 30, to set the volume of the second accommodating cavity 31. In this way, the volume of the second accommodating cavity 31 can be flexibly adjusted, so that a total volume of the second accommodating cavity 31 is optimal, thereby avoiding a waste of a heat storage material and space of the heat conducting layer 3 due to an excessively large volume of the second accommodating cavity 31, and avoiding an insufficient heat storage capability due to an excessively small volume of the second accommodating cavity 31. Therefore, a specific shape of the second accommodating cavity 31 is not limited in this embodiment of this application, and the second accommodating cavity 31 may be a cube, a cylinder, or in another special-shaped cavity structure.

In some embodiments, as shown in FIG. 9, the at least one second accommodating cavity 31 runs through the third surface 32 and the fourth surface 33, and the heat storage portion 20 is embedded in the second accommodating cavity 31. In this embodiment of this application, the second accommodating cavity 31 is formed on the heat conducting layer 3 through mechanical machining, chemical etching, or optical etching. In this case, the second accommodating cavity 31 is an opening through the third surface 32 and the fourth surface 33, and then the second accommodating cavity 31 is filled with a heat storage material to form the heat storage portion 20. In some embodiments, a thickness of the heat storage portion 20 is consistent with a thickness of the heat conducting layer 3, that is, an upper surface of the heat storage portion 20 is flush with the third surface 32, and a lower surface of the heat storage portion 20 is flush with the fourth surface 33. It may be understood that, in another embodiment, the upper surface of the heat storage portion 20 may also be lower than the third surface 32 or the fourth surface 33. To closely combine a contact interface between the heat conducting layer 3 and the insulating substrate 2 and a contact interface between the heat conducting layer 3 and a heat dissipation apparatus 1100, the heat storage portion 20 is usually not disposed to protrude from the heat conducting layer 3.

Figure 10:
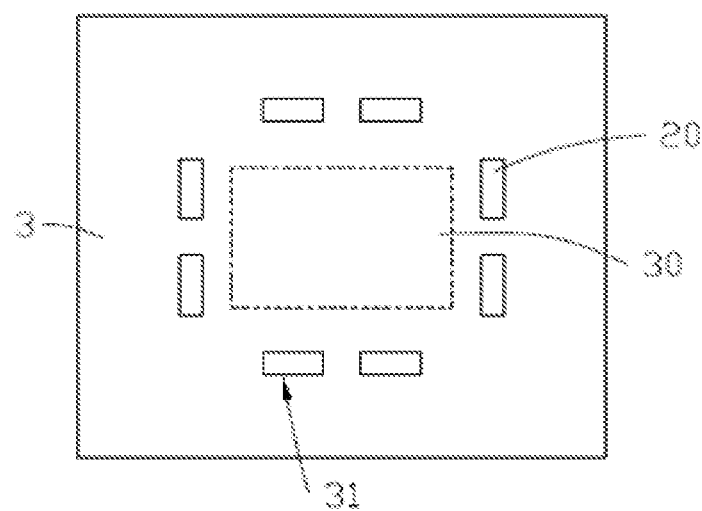
FIG. 10 is a schematic diagram of a structure of a packaged device according to still another embodiment of this application.

In some embodiments, as shown in FIG. 10, a plurality of second accommodating cavities 31 may be disposed around the electronic component 30, so that the plurality of heat storage portions 20 are as close as possible to the electronic component 30. In this way, a large amount of heat generated by the electronic component 30 in a short time can be stored in the heat storage portion 20 more quickly. This solution is particularly applicable to a case in which a short-time current of the electronic component 30 is relatively large or a short-time loss is relatively high. It may be understood that, when the heat storage portion 20 is disposed on the heat conducting layer 3, the heat storage portion may be further disposed in a projection area of the electronic component 30, that is, the second accommodating cavity 31 is disposed on the heat conducting layer 3 facing the electronic component 30.

Figure 11:
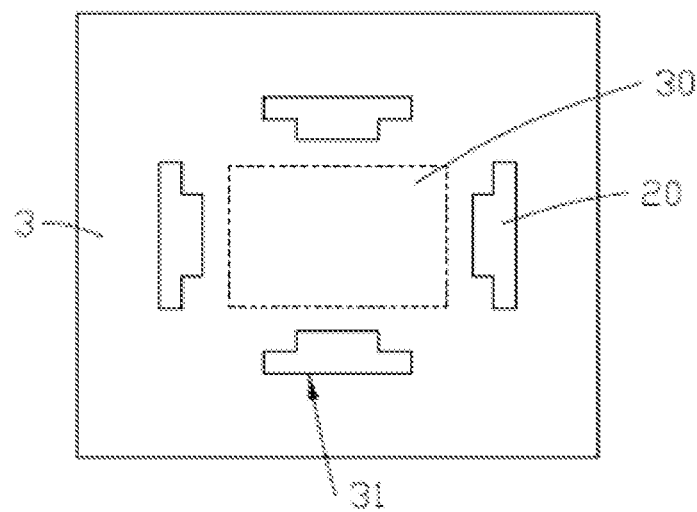
FIG. 11 is a schematic diagram of a structure of a packaged device according to still another embodiment of this application.

In another embodiment, as shown in FIG. 11, the at least one second accommodating cavity 31 is of a special-shaped cavity structure, including but not limited to a ladder-shaped cavity structure, a convex-shaped cavity structure, and the like, where the heat storage portion 20 is embedded in the second accommodating cavity 31 of the special-shaped structure. The second accommodating cavity 31 is set as a cavity structure having a special shape, so that a volume of the heat storage portion 20 can be increased, which is particularly applicable to an electronic component 30 with a relatively large short-time current or a relatively high short-time loss, so that a short-time high temperature of the electronic component 30 can be quickly reduced.

It may be further understood that, in another embodiment, the second accommodating cavities 31 of the different types may be combined based on an actual volume of the heat storage portion 20 and a distance from the heat storage portion 20 to the electronic component 30.

An example heat dissipation path of the packaged device 200 is as follows. When the loss of the electronic component 30 is at a normal level, the loss is transferred to the outside of the packaged device 200 via the conducting layer 1, the insulating substrate 2, and the heat conducting layer 3 of the circuit board 10, so that a temperature of the electronic component 30 is kept within a normal working range, to achieve the purpose of heat dissipation. When the loss of the electronic component 30 suddenly increases in a short time, the loss is not transferred to the outside of the packaged device 200 in time, and most of the loss is transferred to the heat conducting layer 3 and the heat storage portion 20 in the heat conducting layer 3 via the conducting layer 1 and the insulating substrate 2, and is temporarily stored in the heat storage portion 20, so that in this case, a temperature rising amplitude of the electronic component 30 is significantly lower than that of a conventional packaged device without the heat storage portion 20, thereby avoiding damage to the electronic component 30 due to overheating in a short time. When the loss of the electronic component 30 recovers to a normal level, the heat previously stored in the heat storage portion 20 embedded in the heat conducting layer 3 is directly transferred to the outside of the packaged device 100 step by step, so that the temperature of the electronic component 30 gradually recovers to the normal working range.

Compared with the foregoing embodiment, the packaged device 200 in this embodiment is constructed by embedding the heat storage portion 20 in the heat conducting layer 3, a process is simple and easy to realize, and an overall thickness of the circuit board 10 is not affected. This helps reduce a volume of the packaged device 100 while ensuring an excellent heat storage and heat dissipation capability. In addition, because a heat conducting layer 3 of a power semiconductor device is usually thicker than the conducting layer 1, it is more convenient to embed a heat storage material into the heat conducting layer 3, which is especially applicable to a case in which the conducting layer 1 is too thin to be embedded with the heat storage material. By embedding the heat storage portion 20 into the heat conducting layer 3, the heat storage portion 20 may be closer to a heat emitting point (that is, the electronic component 30), and heat can reach the heat storage portion 20 more quickly. In addition, the heat storage portion 20 is connected to the heat conducting layer 3 in an embedded manner, so that a tightness of interface contact between the heat storage portion 20 and the heat conducting layer 3 can be improved, to increase a heat diffusion rate, thereby reducing a temperature of the electronic component 30 in time.

Embodiment 3

Figure 12:
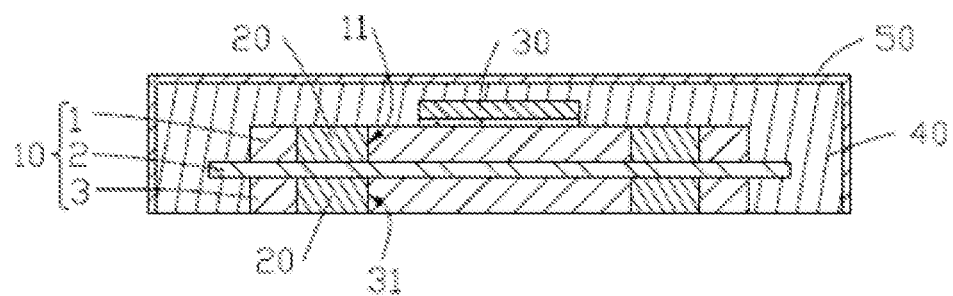
FIG. 12 is a schematic diagram of a structure of a packaged device according to still another embodiment of this application.

Refer to FIG. 12, another embodiment of this application provides a packaged device 300. A difference between the packaged device 300 and the packaged device 100 or the packaged device 200 in the foregoing embodiment lies in that: a heat storage portion 20 is embedded into both a conducting layer 1 adjacent to an electronic component 30 and a heat conducting layer 3. For an example embedding manner, refer to the foregoing packaged device 100 and the packaged device 200. Details are not described herein again.

An example heat dissipation path of the packaged device 300 is as follows. When the loss of the electronic component 30 is at a normal level, the loss is transferred to the outside of the packaged device 300 via the conducting layer 1, the insulating substrate 2, and the heat conducting layer 3 of the circuit board 10, so that a temperature of the electronic component 30 is kept within a normal working range, to achieve the purpose of heat dissipation. When a loss of the electronic component 30 suddenly increases in a short time, the loss is not transferred to the outside of the packaged device 200 in time, where a part of the loss is transferred, via the conducting layer 1, to the heat storage portion 20 embedded in the conducting layer 1, and is temporarily stored in the heat storage portion 20, and another part of the loss is transferred, via the conducting layer 1 and the insulating substrate 2, to the heat conducting layer 3 and the heat storage portion 20 embedded in the heat conducting layer 3, and is temporarily stored in the heat storage portion 20. In this case, a temperature rising amplitude of the electronic component 30 is significantly lower than that of a conventional packaged device without the heat storage portion 20, thereby avoiding damage to the electronic component 30 due to short-time overheating. When the loss of the electronic component 30 is restored to a normal level, heat previously stored in the heat storage portion 20 embedded in the conducting layer 1 is gradually transferred to the outside of the packaged device 300 via the insulating substrate 2 and the heat conducting layer 3, and the heat stored in the heat storage portion 20 embedded in the heat conducting layer 3 is directly released to the outside of the packaged device 300 step by step, so that the temperature of the electronic component 30 is gradually restored to the normal working range.

Compared with the foregoing embodiment, in this embodiment, the heat storage portion 20 is embedded in both the conducting layer 1 adjacent to the electronic component 30 and the heat conducting layer 3, so that a volume of the heat storage portion 20 can be increased, which is applicable to the electronic component 30 with a relatively large short-time current or a relatively high short-time loss, so that a short-time high temperature of the electronic component 30 can be quickly reduced, a risk of damage to the electronic component 30 can be reduced, a working range of the packaged device 300 is further expanded, and reliability of the packaged device 300 is improved.

Embodiment 4

Figure 13:
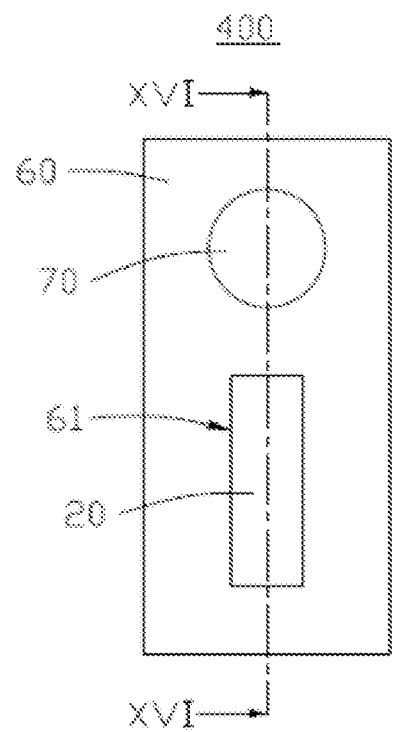
FIG. 13 is a schematic diagram of a structure of a packaged device according to still another embodiment of this application.

Refer to FIG. 13, another embodiment of this application provides a packaged device 400. The packaged device 400 includes a circuit board, an electronic component 70, and a heat storage portion 20. The circuit board is only a conducting layer 60, the electronic component 70 is located on the conducting layer 60 and is electrically connected to the conducting layer 60, and the heat storage portion 20 is embedded in the conducting layer 60 and is adjacent to the electronic component 70. A specific heat capacity of the heat storage portion 20 is higher than a specific heat capacity of the conducting layer 60, and the heat storage portion 20 is configured to store and release heat. The heat is mainly generated by the electronic component 70.

Figure 14:
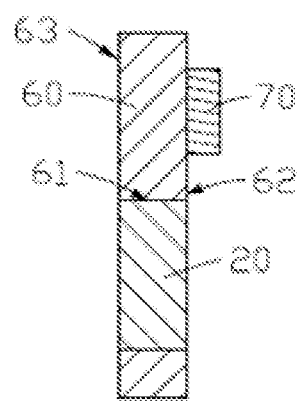
FIG. 14 is a section view of a packaged device in FIG. 13 along XVI-XVI.
Figure 15:
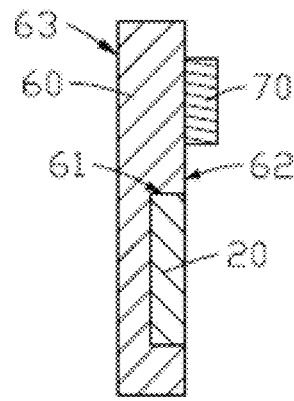
FIG. 15 is a schematic diagram of a structure of a packaged device according to still another embodiment of this application.
Figure 16:
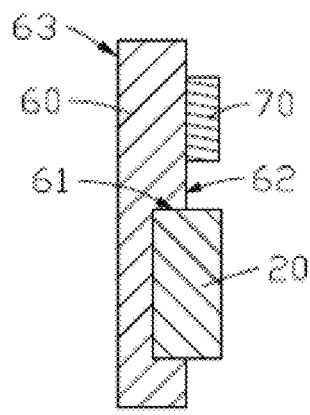
FIG. 16 is a schematic diagram of a structure of a packaged device according to still another embodiment of this application.

The conducting layer 60 includes a first surface 62 and a second surface 63 that are disposed opposite to each other, and the electronic component 70 is located on the first surface 62. At least one first accommodating cavity 61 is disposed on the conducting layer 60, and the at least one first accommodating cavity 61 runs through at least one of the first surface 62 and the second surface 63 to form a structure of a first recess portion, a second recess portion, and a through hole portion described above. The heat storage portion 20 is accommodated in the at least one first accommodating cavity 61. As shown in FIG. 14, the at least one first accommodating cavity 61 runs through the first surface 62 and the second surface 63 to form the through hole portion, the heat storage portion 20 is embedded in the through hole portion, and a surface of the heat storage portion 20 does not protrude from a surface of the conducting layer 60. As shown in FIG. 15, the at least one first accommodating cavity 61 runs through the first surface 62 to form the first recess portion, the heat storage portion 20 is embedded in the first recess portion, and the surface of the heat storage portion 20 is flush with the first surface 62. As shown in FIG. 16, the at least one first accommodating cavity 61 runs through the first surface 62 to form the first recess portion, the heat storage portion 20 is embedded in the first recess portion, and the surface of the heat storage portion 20 protrudes from the first surface 62.

For a forming method of the first accommodating cavity 61, a material of the heat storage portion, a material of the conducting layer, and the like, refer to the foregoing embodiment. Details are not described herein again.

In some embodiments, the packaged device 400 is a power switch device, and the electronic component 70 is a switch contact. The switch contact is connected to the conducting layer 60 in a manner of welding, sintering, or riveting. When the contact is in contact with another adjacent contact in physical space, electrical conduction is implemented, and when the switch is turned off, the contact is separated from the other adjacent contact in physical space, to implement electrical shutdown.

An example heat dissipation path of the packaged device 400 as the power switch device includes that when a loss of the switch contact (that is, the electronic component 70) is at a normal level, the loss is transferred to the outside of the packaged device 400 via the conducting layer 60, so that a temperature of the contact is kept within a normal working range. When a loss of the switch contact suddenly increases in a short time, the loss is not transferred to the outside of the packaged device 400 in time, and most of the loss is transferred to the heat storage portion 20 via the conducting layer 60, and is temporarily stored in the heat storage portion 20, so that in this case, a temperature rising amplitude of the contact is significantly lower than that of a conventional power switch device without the heat storage portion 20, thereby avoiding damage to the switch contact due to overheating in a short time. When the loss of the switch contact recovers to a normal level, the heat previously stored in the heat storage portion 20 is gradually transferred to the outside of the packaged device 400 via the conducting layer 60, so that the temperature of the contact gradually recovers to the normal working range.

The heat storage portion 20 is applicable to a relatively large quantity of application scenarios, and is also applicable when the electronic component 70 is welded only to the conducting layer 60 (for example, the power switch device). The heat storage portion 20 is introduced into the packaged device 400, so that the heat storage portion 20 is closer to the heating electronic component 70. The heat storage portion 20 can quickly store a large amount of heat generated by the electronic component 70 in a short time, thereby quickly and effectively reducing the temperature of the electronic component 70, and reducing a risk of damage to the electronic component 70. A capability of the packaged device 400 to withstand a short-time high current or a short-time high loss is improved, and a working range of the packaged device 400 is further expanded, thereby improving reliability of the packaged device 400.

Embodiment 5

Figure 17:
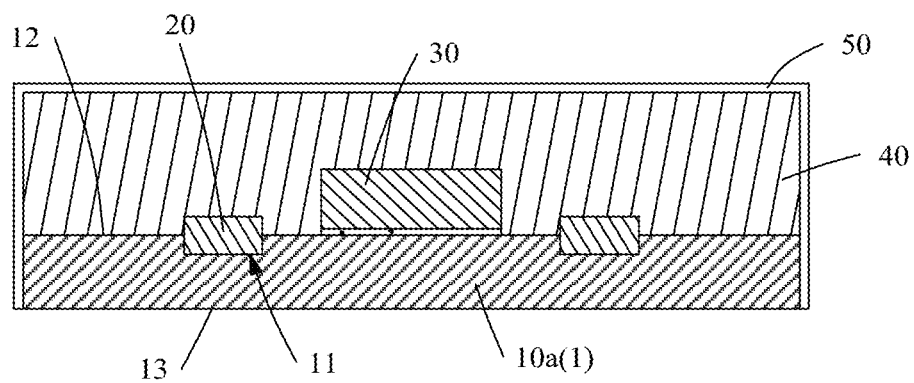
FIG. 17 is a schematic diagram of a structure of a packaged device according to still another embodiment of this application.

Refer to FIG. 17, another embodiment of this application provides a packaged device 500 with good heat storage and heat dissipation capabilities. The packaged device 500 may be but is not limited to a power semiconductor device, and may be configured to perform power processing, including frequency conversion, voltage conversion, current conversion, power management, and the like.

A difference between the packaged device 500 and the packaged device 100 provided in the foregoing embodiment lies in that: the packaged device 500 includes a circuit board 10a, an electronic component 30, and a heat storage portion 20. The electronic component 30 is electrically connected to the circuit board 10a, and the heat storage portion 20 is embedded in the circuit board 10a and is adjacent to the electronic component 30, where a specific heat capacity of the heat storage portion 20 is higher than a specific heat capacity of the circuit board 10a, and the heat storage portion 20 is configured to store and release heat. In a working process of the packaged device 500, both the electronic component 30 and the circuit board 10a generate heat, but heat generated by the electronic component 30 is mainly used. Therefore, the heat storage portion 20 is mainly configured to store and release heat generated by the electronic component 30.

Figure 18:
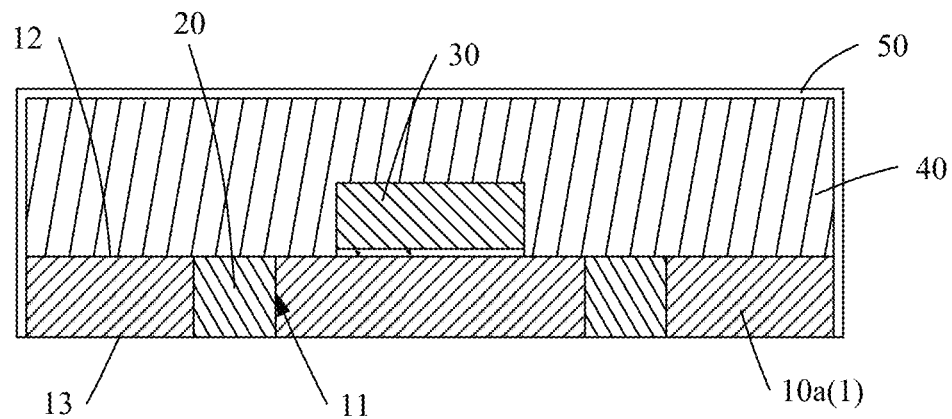
FIG. 18 is a schematic diagram of a structure of a packaged device according to still another embodiment of this application.
Figure 19:
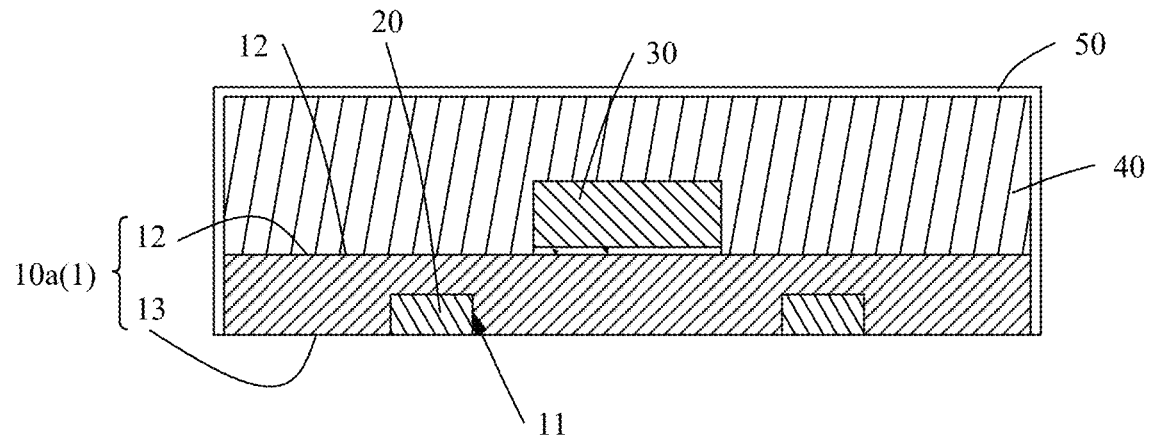
FIG. 19 is a schematic diagram of a structure of a packaged device according to still another embodiment of this application.

As shown in FIG. 17, the circuit board 10a may include only a conducting layer 1, and the conducting layer 1 includes a first surface 12 and a second surface 13 that are disposed opposite to each other. Refer to FIG. 2, the first surface 12 is a first circuit board surface 101 in FIG. 2, the second surface 13 is a second circuit board surface 102 in FIG. 2, and accommodating space is a first accommodating cavity 11 disposed on the conducting layer 1. As shown in FIG. 17, the first accommodating cavity 11 may run through the first surface 12 to form a first recess portion with an opening facing upward, and the heat storage portion 20 is embedded in the first accommodating cavity 11. As shown in FIG. 18, in another embodiment, the first accommodating cavity 11 may run through the first surface 12 and the second surface 13 to form a through hole portion, and the heat storage portion 20 is embedded in the first accommodating cavity 11. As shown in FIG. 19, in still another embodiment, the first accommodating cavity 11 may further run through the second surface 13 to form a second recess portion with an opening facing downward, and the heat storage portion 20 is embedded in the first accommodating cavity 11. It may be further understood that the foregoing three forms of the first accommodating cavity 11 may be combined in any manner.

In some embodiments, a material of the conducting layer 1 may be metal, for example, copper or copper alloy, that is, the circuit board may be a single-layer board.

It may be understood that there may be one or more circuit boards 10a, and the plurality of circuit boards 10a may be electrically connected to each other.

Compared with the foregoing embodiment, the circuit board 10a in this embodiment is a single-layer conducting layer 1, which further extends a structure form of the circuit board 10a and expands an applicable scenario of the heat storage portion 20. The heat storage portion 20 is disposed on the conducting layer 1, so that a short-time high temperature of the electronic component 30 can be quickly reduced, a risk of damage to the electronic component 30 is reduced, and reliability of the packaged device 500 is improved.

Embodiment 6

Figure 20:
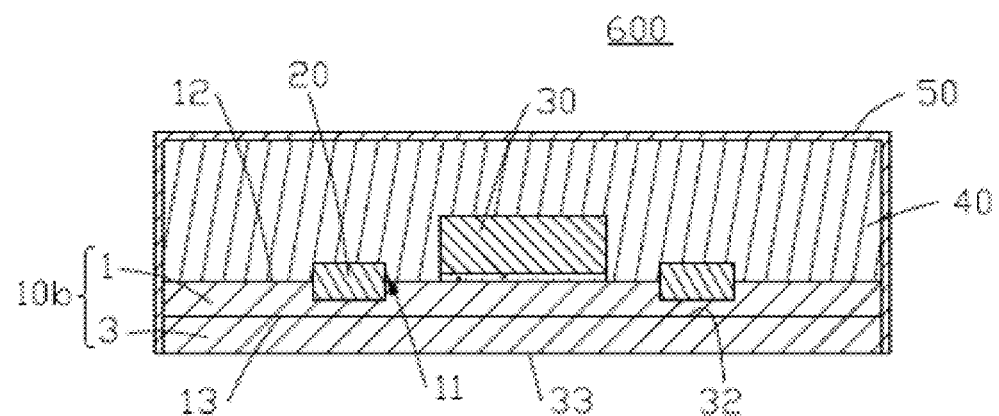
FIG. 20 is a schematic diagram of a structure of a packaged device according to still another embodiment of this application.

Refer to FIG. 20, another embodiment of this application provides a packaged device 600. A difference between the packaged device 600 and the packaged device 500 in the foregoing embodiment lies in that: a circuit board 10b includes a conducting layer 1 and a heat conducting layer 3 that are sequentially stacked, where the conducting layer 1 is electrically connected to an electronic component 30, and a heat storage portion 20 may be embedded in at least one of the conducting layer 1 and the heat conducting layer 3.

As shown in FIG. 20, with reference to FIG. 2, in some embodiments, the heat storage portion 20 is embedded in the conducting layer 1 adjacent to the electronic component 30. The conducting layer 1 includes a first surface 12 and a second surface 13 that are disposed opposite to each other, the first surface 12 forms a first circuit board surface 101 in FIG. 2, and the electronic component 30 is located on the first surface 12. Accommodating space in FIG. 2 includes at least one first accommodating cavity 11 located on the conducting layer 1, the first accommodating cavity 11 runs through the first surface 12, and the heat storage portion 20 is accommodated in the first accommodating cavity 11. It may be understood that the first accommodating cavity 11 may further run through the second surface 13, or run through the first surface 12 and the second surface 13. For an example arrangement form of the first accommodating cavity 11, refer to the foregoing embodiment. Details are not described herein again.

Figure 21:
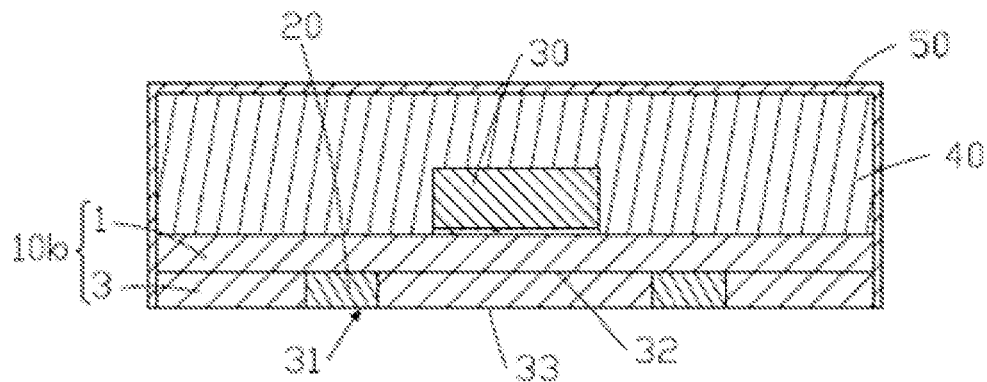
FIG. 21 is a schematic diagram of a structure of a packaged device according to still another embodiment of this application.

As shown in FIG. 21, with reference to FIG. 2, in some embodiments, the heat storage portion 20 is embedded in the heat conducting layer 3 adjacent to the electronic component 30, the heat conducting layer 3 includes a third surface 32 close to the conducting layer 1 and a fourth surface 33 away from the conducting layer 1, the fourth surface 33 of the heat conducting layer 3 forms a second circuit board surface 102 in FIG. 2, and the accommodating space may further include at least one second accommodating cavity 31 located on the heat conducting layer 3. The second accommodating cavity 31 is disposed adjacent to the electronic component 30, and the heat storage portion 20 is located in the second accommodating cavity 31. For an example arrangement form of the second accommodating cavity 31, refer to the foregoing embodiment. Details are not described herein again.

The heat storage portion 20 is applicable to many application scenarios. In this embodiment, the circuit board 10b is a double-layer board, which extends a structure form of the circuit board 10b. The heat storage portion 20 is disposed in at least one of the conducting layer 1 and the heat conducting layer 3, so that the heat storage portion 20 is closer to the heating electronic component 30. The heat storage portion 20 can quickly store a large amount of heat generated by the electronic component 30 in a short time, thereby quickly and effectively reducing the temperature of the electronic component 30, and reducing a risk of damage to the electronic component 30.

Figure 22:
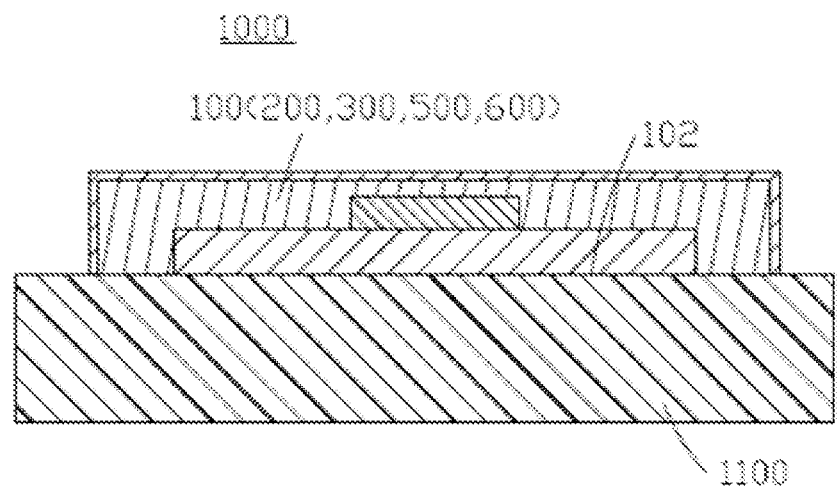
FIG. 22 is a schematic diagram of a structure of a packaged module according to an embodiment of this application.

Refer to FIG. 22, an embodiment of this application provides a packaged module 1000. The packaged module 1000 includes a packaged device 100 (or 200, 300, 500, 600) and a heat dissipation apparatus 1100. The heat dissipation apparatus 1100 is disposed on an outer surface of the packaged device 100 (or 200, 300, 500, 600). The heat dissipation apparatus 1100 is connected to the second circuit board surface 102 of the circuit board. By using the packaged device 100 (or 200, 300, 500, 600) provided in this embodiment of this application, a heat dissipation apparatus 1100 is disposed on the second circuit board surface 102, to help improve a heat dissipation effect of the packaged module 1000.

In some embodiments, the packaged device 100 (or 200, 300, 500, 600) may be connected to the heat dissipation apparatus 1100 by welding or a heat conducting interface material. It may be understood that, the connection between the packaged device 100 (or 200, 300, 500, 600) and the heat dissipation apparatus 1100 may be implemented in another manner, for example, a screw connection. To further improve heat conduction efficiency, a sealing pad may be added between the packaged device 100 (or 200, 300, 500, 600) and the heat dissipation apparatus 1100.

Figure 23:
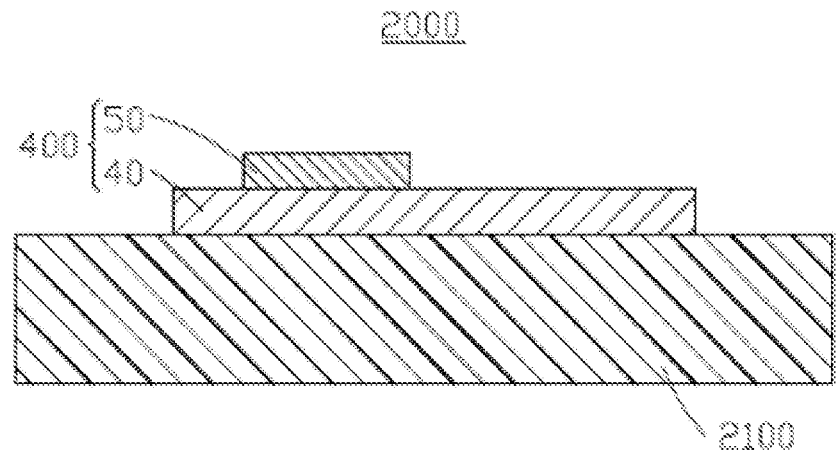
FIG. 23 is a schematic diagram of a structure of a packaged module according to another embodiment of this application.

Refer to FIG. 23, another embodiment of this application provides a packaged module 2000. A difference between the packaged module 2000 and the foregoing packaged module 1000 lies in that the packaged module 2000 includes a packaged device 400 and a heat dissipation apparatus 2100. The heat dissipation apparatus 2100 is disposed on an outer surface of the packaged device 400. The heat dissipation apparatus 2100 is connected to a surface that is of a conducting layer 60 and that is away from an electronic component 70. According to the packaged device 400 provided in this embodiment of this application, a heat dissipation apparatus 2100 is disposed on the surface that is of the conducting layer 60 and that is away from the electronic component 70, to help improve a heat dissipation effect of the packaged module 2000.

For a manner of connecting the heat dissipation apparatus 2100 to the packaged device 400, refer to the foregoing packaged module 1000. Details are not described herein again.

Figure 24:
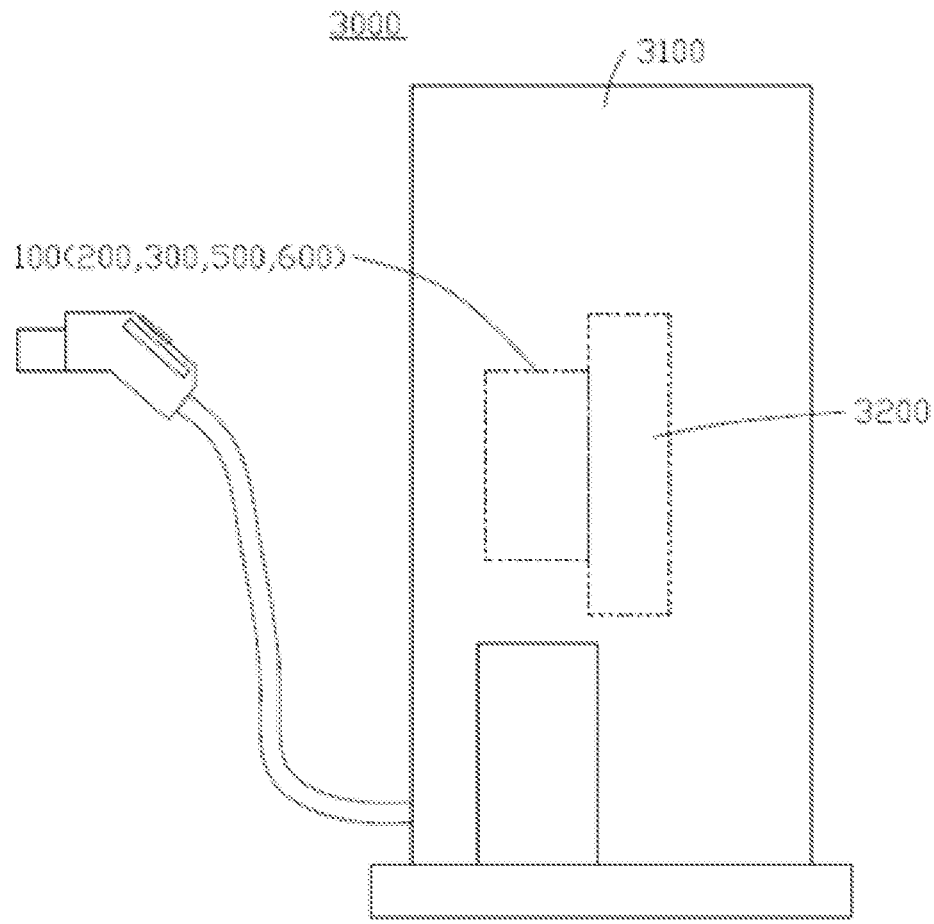
FIG. 24 is a schematic diagram of a structure of a power conversion device according to an embodiment of this application.

As shown in FIG. 24, an embodiment of this application further provides a power conversion device 3000 to which the packaged device 100 (or 200, 300, 500, 600) or the packaged module 1000 is applied. The power conversion device 3000 includes a housing 3100 and the packaged device 100 (or 200, 300, 500, 600) or the packaged module 1000 disposed in the housing 3100. The power conversion device 3000 further includes a circuit board 3200, and the packaged device 100 (or 200, 300, 500, 600) or the packaged module 1000 is disposed on the circuit board 3200. It may be understood that the circuit board 3200 may be a circuit board having a short-time heat storage capability similar to a structure of the foregoing circuit board, or may be another circuit board different from the foregoing circuit board. The power conversion device 3000 may be an in-vehicle power supply, a photovoltaic inverter, site energy, industrial motor drive, or the like. In this embodiment, the power conversion device 3000 is an electric vehicle charging pile.

In the power conversion device 3000, the packaged device 100 (or 200, 300, 500, 600) can have a good short-time heat storage and good heat dissipation capability, and reduce a risk of damage caused by a sharp increase in a temperature of the electronic component 30 in a working process in a short time, thereby improving reliability of the power conversion device 3000 and prolonging a service life of the power conversion device 3000.

Figure 25:
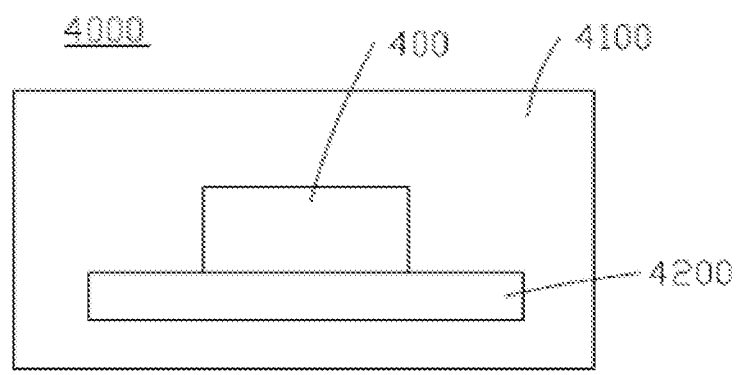
FIG. 25 is a schematic diagram of a structure of a power conversion device according to another embodiment of this application.

As shown in FIG. 25, another embodiment of this application further provides a power conversion device 4000 to which the packaged device 400 or the packaged module 2000 is applied. The power conversion device 4000 includes a housing 4100 and the packaged device 400 or the packaged module 2000 disposed in the housing 4100. The power conversion device 4000 further includes a circuit board 4200, and the packaged device 400 or the packaged module 2000 is disposed on the circuit board 4200. In this embodiment, the power conversion device 4000 may be a switching power supply, but is not limited thereto. It may be understood that the circuit board 4200 may be a circuit board having a short-time heat storage capability similar to a structure of the foregoing circuit board, or may be another circuit board different from the foregoing circuit board.

In the power conversion device 4000, the packaged device 400 can have a good short-time heat storage and good heat dissipation capability, and reduce a risk of damage caused by a sharp increase in a temperature of the electronic component 70 in a working process in a short time, thereby improving reliability of the power conversion device 4000 and prolonging a service life of the power conversion device 4000.

It should be noted that the foregoing descriptions are merely implementations of this application, but are not intended to limit the protection scope of this application. Any variation or replacement readily figured out by a person skilled in the art within the technical scope disclosed in this application shall fall within the protection scope of this application. In the case of no conflict, the implementations of this application and the features in the implementations may be mutually combined. Therefore, the protection scope of this application shall be subject to the protection scope of the claims.

What is claimed is:

1. A packaged device comprising:
 a circuit board comprising:
  at least one electrically conducting layer having a first specific heat capacity,
  an insulating ceramic substrate having a second specific heat capacity,
  a first circuit board surface and a second circuit board surface disposed opposite to each other, and
  an accommodating space that runs through the first circuit board surface and the second circuit board surface to form a through hole portion of the circuit board;
 an electronic component located on the first circuit board surface and electrically coupled to the at least one electrically conductor layer of the circuit board; and
 a heat storage portion embedded in the accommodating space, ends of the heat storage portion being substantially coplanar with the first circuit board surface and the second circuit board surface, respectively, the heat storage portion disposed adjacent to the electronic component, and the heat storage portion comprises a phase-change material,
 wherein a phase of the phase-change material of the heat storage portion has a third specific heat capacity that is higher than the second specific heat capacity of the insulating ceramic substrate and the first specific heat capacity of each of the at least one electrically conducting layer, and
 wherein the heat storage portion is configured to store heat and release the heat.

2. The packaged device of claim 1, wherein the at least one electrically conducting layer comprises:
 a first electrically conducting layer having a first surface forming the first circuit board surface and an opposing second surface; and
 a second electrically conducting layer having a third surface disposed opposite to the first surface and forming the second circuit board surface.

3. The packaged device of claim 2, wherein the accommodating space comprises an accommodating cavity located through the first electrically conducting layer and configured to accommodate the heat storage portion.

4. The packaged device of claim 3, wherein the at least one electrically conducting layer comprises a non-electrical through-current area, and wherein the accommodating cavity is disposed in the non-electrical through-current area.

5. The packaged device of claim 2, wherein the second electrically conducting layer comprises a side that is located away from the electronic component, and wherein the second electrically conducting layer being a heat conducting layer disposed on the side and comprising:
 a fourth surface facing the second surface; and
 the third surface disposed opposite to the fourth surface and configured to form the second circuit board surface.

6. The packaged device of claim 5, wherein the accommodating cavity located through the heat conducting layer and configured to accommodate the heat storage portion.

7. The packaged device of claim 6, wherein the insulating ceramic substrate being located between the first electrically conducting layer and the heat conducting layer.

8. The packaged device of claim 1, further comprising a package body configured to package the circuit board, the electronic component, and the heat storage portion.

9. A packaged system comprising:
a packaged device comprising:
  a circuit board comprising:
    at least one electrically conducting layer having a first specific heat capacity,
    an insulating ceramic substrate having a second specific heat capacity, and
    a first surface
  and an opposite second surface;
  an electronic component located on the first surface of the circuit board and electrically coupled to the at least one electrically conductor layer of the circuit board; and
  a heat storage portion running through the circuit board from the first surface to the second surface, ends of the heat storage portion being substantially coplanar with the first surface and the second surface, respectively, the heat storage portion being disposed adjacent to the electronic component, and the heat storage portion comprises a phase-change material,
  wherein a phase of the phase-change material of the heat storage portion has a third specific heat capacity that is higher than the second specific heat capacity of the insulating ceramic substrate and the first specific heat capacity of each of the at least one electrically conducting layer,
  wherein the heat storage portion is configured to store heat and release the heat, and
a heat dissipation apparatus located on the surface and configured to receive the heat.

10. A power conversion device comprising:
a first circuit board; and
a packaged device disposed on the first circuit board and comprising:
  a second circuit board comprising:
    at least one electrically conducting layer having a first specific heat capacity,
    an insulating ceramic substrate having a second specific heat capacity,
    a first circuit board surface and a second circuit board surface that are disposed opposite to each other, and
    an accommodating space that runs through the first circuit board surface and the second circuit board surface to form a through hole portion of the second circuit board; and
  an electronic component located on the first circuit board surface of the second circuit board surface and electrically coupled to the at least one electrically conductor layer of the second circuit board; and
  a heat storage portion embedded in the accommodating space, ends of the heat storage portion being substantially coplanar with each of the first circuit board surface and the second circuit board surface, respectively, the heat storage portion disposed adjacent to the electronic component, and the heat storage portion comprises a phase-change material,
  wherein a phase of the phase-change material of the heat storage portion has a third specific heat capacity that is higher than the second specific heat capacity of the insulating ceramic substrate and the first specific heat capacity of each of the at least one electrically conducting layer, and
  wherein the heat storage portion is configured to store heat and release the heat.

11. The power conversion device of claim 10, wherein the at least one electrically conducting layer comprises:
  a first electrically conducting layer having a first surface forming the first circuit board surface, and an opposing second surface; and
  a second electrically conducting layer having a third surface disposed opposite to the first surface and configured to forming the second circuit board surface.

12. The power conversion device of claim 11, wherein the accommodating space comprises an accommodating cavity located through the first electrically conducting layer and configured to accommodate the heat storage portion.

13. The power conversion device of claim 12, wherein the at least one electrically conducting layer comprises a non-electrical through-current area, and wherein the accommodating cavity is disposed in the non-electrical through-current area.

14. The power conversion device of claim 13, wherein the second electrically conducting layer comprises a side that is located away from the electronic component, and wherein second electrically conducting layer being a heat conducting layer disposed on the side and comprising:
  a fourth surface facing the second surface; and
  the third surface disposed opposite to the fourth surface and configured to form the second circuit board surface.

15. The power conversion device of claim 14, wherein the accommodating cavity located through the heat conducting layer and configured to accommodate the heat storage portion.

* * * * *